United States Patent
Nishimoto

(10) Patent No.: US 9,490,375 B2
(45) Date of Patent: Nov. 8, 2016

(54) SOLAR CELL AND METHOD FOR MANUFACTURING THE SAME, AND SOLAR CELL MODULE

(75) Inventor: Yoichiro Nishimoto, Chiyoda-ku (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 356 days.

(21) Appl. No.: 14/009,132

(22) PCT Filed: Apr. 4, 2011

(86) PCT No.: PCT/JP2011/058542
§ 371 (c)(1),
(2), (4) Date: Oct. 1, 2013

(87) PCT Pub. No.: WO2012/137291
PCT Pub. Date: Oct. 11, 2012

(65) Prior Publication Data
US 2014/0026955 A1   Jan. 30, 2014

(51) Int. Cl.
*H01L 31/0224* (2006.01)
*H01L 31/05* (2014.01)

(52) U.S. Cl.
CPC . *H01L 31/022425* (2013.01); *H01L 31/02245* (2013.01); *H01L 31/0516* (2013.01); *Y02E 10/50* (2013.01)

(58) Field of Classification Search
CPC .............. H01L 31/02245; H01L 31/0516; H01L 31/022425; Y02E 10/50
USPC .......................................................... 136/256
See application file for complete search history.

(56) References Cited

U.S. PATENT DOCUMENTS 8,053,666 B2   11/2011   Hishida
8,258,397 B2   9/2012   Nishida et al.
(Continued)

FOREIGN PATENT DOCUMENTS

CN   101889349 A   11/2010
JP   56-154172   11/1981
(Continued)

OTHER PUBLICATIONS

Office Action (Notice of Final Rejection) issued on May 7, 2014, by the Japanese Patent Office in corresponding Japanese Patent Application No. 2013-508653, and an English Translation of the Office Action. (4 pages).
(Continued)

*Primary Examiner* — Devina Pillay
(74) *Attorney, Agent, or Firm* — Buchanan Ingersoll & Rooney PC

(57) ABSTRACT

A solar cell includes a first conductive type semiconductor substrate in which a through hole is formed, a second conductive type impurity diffusion layer provided on one-surface side of the semiconductor substrate, a light-receiving surface electrode provided to be electrically connected to the impurity diffusion layer, a lead-out electrode led out to the other-surface side of the semiconductor substrate via the through hole and provided to be electrically connected to the light-receiving surface electrode, and a back-surface electrode electrically connected to the semiconductor substrate on the other-surface side of the semiconductor substrate and electrically separated from the lead-out electrode. The lead-out electrode contains a metal member inside the through hole and is electrically connected to the light-receiving surface electrode.

9 Claims, 15 Drawing Sheets

(56) References Cited

U.S. PATENT DOCUMENTS

| | | | |
|---|---|---|---|
| 8,338,903 | B2 | 12/2012 | Yamazaki et al. |
| 2007/0186971 | A1 | 8/2007 | Lochun et al. |
| 2009/0056804 | A1 | 3/2009 | Hishida |
| 2009/0114261 | A1* | 5/2009 | Stancel et al. .......... H01L 31/05 136/244 |
| 2010/0024481 | A1 | 2/2010 | Rothstein |
| 2010/0243028 | A1 | 9/2010 | Sainoo et al. |
| 2010/0252903 | A1 | 10/2010 | Yamazaki et al. |
| 2010/0275987 | A1* | 11/2010 | Sakamoto ......... H01L 31/03529 136/256 |
| 2011/0005582 | A1 | 1/2011 | Szlufcik et al. |

FOREIGN PATENT DOCUMENTS

| | | |
|---|---|---|
| JP | 61-86956 U | 6/1986 |
| JP | 2-51282 A | 2/1990 |
| JP | 4-223378 A | 8/1992 |
| JP | 11-330518 | 11/1999 |
| JP | 11-330518 A | 11/1999 |
| JP | 2000-349318 A | 2/2000 |
| JP | 2000-091602 A | 3/2000 |
| JP | 2001-102617 A | 4/2001 |
| JP | 2007-012730 A | 1/2007 |
| JP | 2007-311425 A | 11/2007 |
| JP | 2008-034609 A | 2/2008 |
| JP | 2008-294080 A | 12/2008 |
| JP | 2009-064840 A | 3/2009 |
| JP | 2009-088406 A | 4/2009 |
| JP | 2009-123761 A | 6/2009 |
| JP | 2010-050350 A | 3/2010 |
| JP | 2010-080576 A | 4/2010 |
| JP | 2010-080578 A | 4/2010 |
| WO | WO 2008/078771 A1 | 7/2008 |
| WO | WO 2009/063754 A1 | 5/2009 |
| WO | WO 2009/066583 A1 | 5/2009 |

OTHER PUBLICATIONS

Office Action issued on Apr. 23, 2015, by the State Intellectual Property Office of the People's Republic of China in corresponding Chinese Patent Application No. 201180069639.X, and an English Language Translation of the Office Action. (10 pages).

Office Action issued on Dec. 24, 2013, by the Taiwanese Patent Office in corresponding Taiwanese Patent Application No. 100131890, and an English Translation of the Office Action. (9 pages).

International Search Report (PCT/ISA/210) mailed on Jul. 5, 2011, by the Japanese Patent Office as the International Searching Authority for International Application No. PCT/JP2011/058542.

Written Opinion (PCT/ISA/237) mailed on Jul. 5, 2011, by the Japanese Patent Office as the International Searching Authority for International Application No. PCT/JP2011/058542.

A. Van Der Heide et al., Industrial Fabrication of Multi-crystalline MWT cells with interconnection flexibility of 16.5% Efficiency, $24^{th}$ European Photovoltaic Solar Energy Conference, Sep. 21-25, 2009, Hamburg, Germany, pp. 942-945.

Japan Notice of Rejection, Application No. JP 2013-508653, Aug. 20, 2013, 7 pages.

Office Action issued on Nov. 10, 2014, by the Taiwanese Patent Office in corresponding Taiwanese Patent Application No. 100131890, and an English translation of the Office Action. (9 pages).

Office Action issued Oct. 30, 2014, by the German Patent Office in corresponding German Patent Application No. 112011105125.5, and an English translation of the Office Action. (13 pages).

* cited by examiner

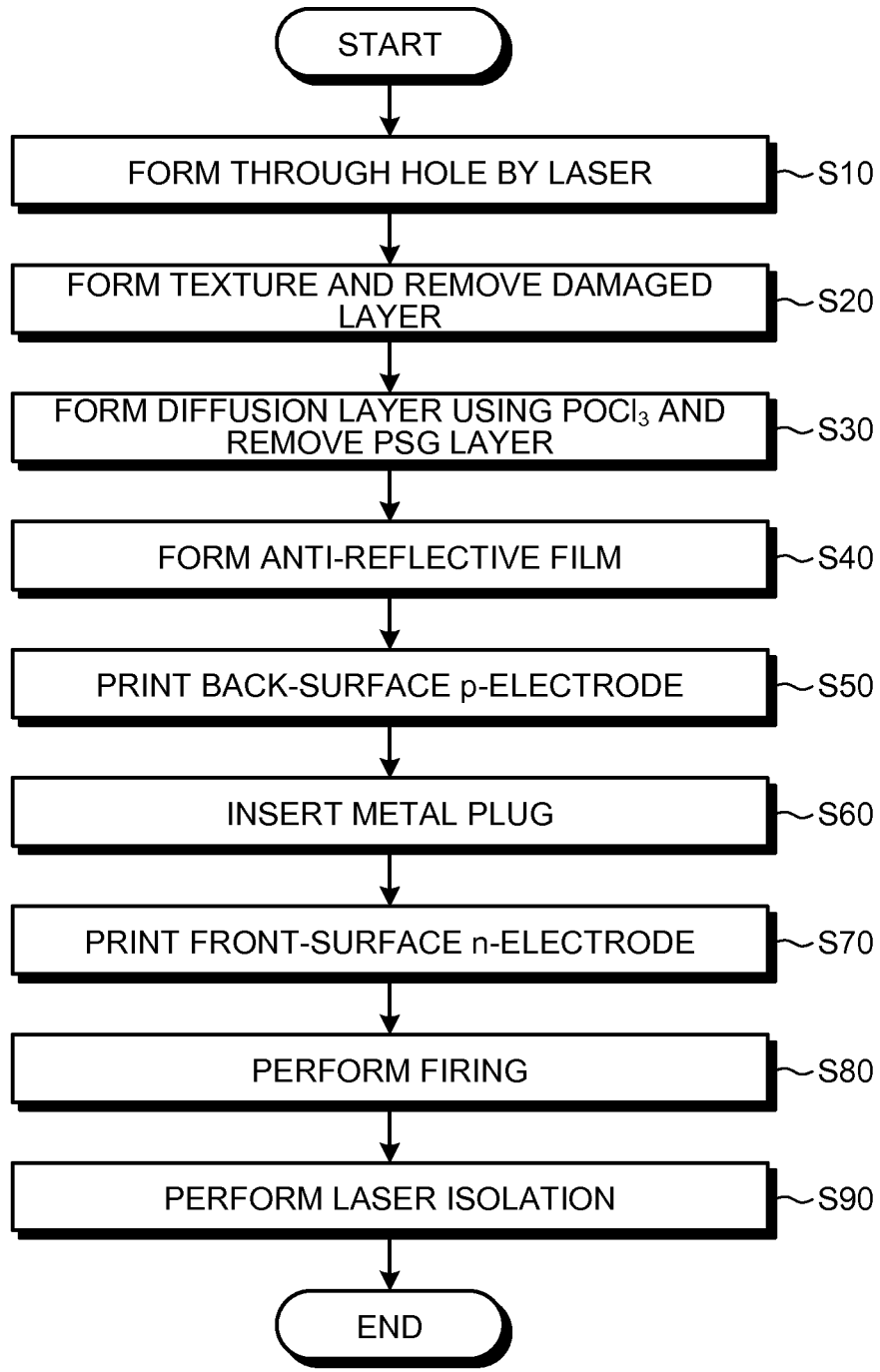

SOLAR CELL AND METHOD FOR MANUFACTURING THE SAME, AND SOLAR CELL MODULE

FIELD

The present invention relates to a solar cell and a method for manufacturing the same, and a solar cell module, and more particularly to a solar cell having a structure in which a light-receiving surface electrode is led out to and arranged on a back-surface side through a through hole and a method for manufacturing the same, and a solar cell module.

BACKGROUND

Conventionally, there is a common structure of a crystal-system silicon (Si) solar cell, which uses an anti-reflective film that is formed on a photoelectric conversion unit having a pn junction formed therein, a comb-shaped front-surface electrode that is formed on a light-receiving-surface side of the photoelectric conversion unit, and a back-surface electrode that is formed on the entire back surface of the photoelectric conversion unit. Because irradiated light is blocked by the front-surface electrode on the light-receiving-surface side, a region covered by the front-surface electrode does not contribute to electric power generation. That is, a so-called shadow loss occurs. The percentage of this shadow loss in the total surface is a little less than 10%.

It is possible to reduce the shadow loss by decreasing the electrode area. However, as the cross-sectional area of the electrode is decreased, the resistance of the electrode is increased, thereby increasing the resistance loss in the front-surface electrode. Because the increase in the resistance loss causes reduction in fill factor (FF), conversion efficiency cannot be increased by simply decreasing the electrode area. When the electrode area is decreased, it is a necessary procedure to reduce the resistance loss, such as by increasing the thickness of the electrode or decreasing the resistivity of an electrode material itself by the amount of the decrease in the electrode area.

As one method to solve the trade-off requirements as described above, a solar cell having a structure in which a front-surface electrode (or a diffusion layer) is arranged on a back surface through a through hole has been studied. The solar cell is referred to as "metal wrap through (MWT) cell" (or "emitter wrap through (EWT) cell" in the case of the diffusion layer) (see, for example, Patent Literatures 1 and 2).

The solar cell having the conventional structure described above has a problem in that when the area of the front-surface electrode is decreased, the resistance loss is increased. However, in the solar cell having the structure as described immediately above, it is possible to use a method in which a bus electrode (all the front-surface electrodes in the EWT cell) is arranged on the back surface, where constraints on the electrode area are eased, to reduce the shadow loss, and also the electrode area is increased to decrease the series resistance. In the solar cell utilizing the through hole as described above, a current collected on the light-receiving-surface side passes through the through hole. Therefore, the number of the through holes and the resistance in the through hole affect characteristics of the solar cell.

For example, a case where one through hole is formed and a case where four through holes are formed are considered in a solar cell having a light-receiving surface area S. Where a photocurrent density is represented as J, and a resistance of the through hole is represented as R, then a resistance loss Ploss1 of the through hole in the case where one through hole is formed is expressed by the following equation (1). On the other hand, a resistance loss Ploss4 of the through hole in the case where four through holes are formed is expressed by the following equation (2). As understood from the equations (1) and (2), as the number of the through holes is larger, the resistance loss can be decreased to a larger extent.

$$Ploss1 = J^2 S^2 R \quad (1)$$

$$Ploss4 = (J \times \tfrac{1}{4} S)^2 \times R \times 4 = \tfrac{1}{4} J^2 S^2 R \quad (2)$$

The resistance of the through hole depends on the diameter of the through hole. A current collected on the light-receiving-surface side flows through metal filled in the through hole in the case of the MWT cell, or flows through the diffusion layer on the side of the through hole in the case of the EWT cell. A volume V of a cylinder with a radius r and a height d is expressed by the following equation (3). Further, a lateral area A of the cylinder with the radius r and the height d is expressed by the following equation (4). Therefore, as the diameter of the through hole is larger, the resistance of the through hole can be lower. That is, a larger diameter of the through hole, and a larger number of the through holes are thought to be preferable in order to achieve high photoelectric conversion efficiency in the MWT cell and the EWT cell.

$$V = \pi r^2 d \quad (3)$$

$$A = 2\pi r \quad (4)$$

Next, a manufacturing process of the MWT cell is explained. There is not any significant difference in the manufacturing process between the EWT cell and the MWT cell, except the position of an electrode. A p-type Si substrate (hereinafter, "substrate") is assumed to be used in this process. However, even when an n-type Si substrate is employed, the same cell can also be produced by changing a diffusion material to an appropriate diffusion material.

First, a through hole is formed on the p-type Si substrate (hereinafter, also "substrate") by laser. Next, minute recesses and projections referred to as "texture" are formed on a surface of the substrate. The texture reduces the surface reflectivity of a solar cell, and high conversion efficiency can be obtained.

The substrate is then heated in a gaseous atmosphere of phosphorus oxychloride ($POCl_3$), thereby forming an n-type impurity diffusion layer on the surface of the substrate to form a semiconductor pn junction. Next, a plasma-enhanced chemical vapor deposition (PECVD) method is used to form a silicon nitride (SiN) film (a PECVD-SiN film), for example, on the light-receiving-surface side of the substrate as an anti-reflective film.

Vapor phase diffusion is performed using $POCl_3$ to form the n-type impurity diffusion layer, and the SiN film formed by the PECVD method (the PECVD-SiN film) is used as the anti-reflective film. However, a spin on dopant (SOD) can also be used to form the n-type impurity diffusion layer. Further, when the substrate to be used is a single-crystal Si substrate, an alternative is to use a silicon thermally-oxidized film ($SiO_2$) as the anti-reflective film. Furthermore, when phosphorus (P)-doped titanium dioxide ($TiO_2$) is used as the SOD, a process of forming the anti-reflective film simultaneously with forming the n-type impurity diffusion layer is also possible.

Thereafter, an electrode is printed and fired on the front surface and back surface of the substrate including the inside of the through hole, and after undergoing isolation by laser, the MWT cell is completed.

As described above, there are several conceivable processes according to the methods for forming the diffusion layer and for forming the anti-reflective film. However, whether the diffusion layer and the anti-reflective film are present or absent in the through hole significantly affects electrode formation, and therefore caution is necessary. In order to form a front-surface electrode of a solar cell, it is common to adopt a so-called fire-through method in which a conductive paste is printed and fired, thereby breaking an anti-reflective film to come into contact with a diffusion layer under the anti-reflective film.

For example, in a case where only the diffusion layer is present in the through hole, a problem arises in that when a fire-through paste is used to fill the through hole, the paste breaks the diffusion layer within the through hole, and forms a leak path, and therefore the paste does not provide desired properties. In this context, Non Patent Literature 1 describes that it is necessary to use a different paste for a back-surface n-type electrode from that used for a front-surface n-type electrode. Further, Patent Literature 3, in which a through hole is formed after forming a pn junction that is a heterojunction, adopts a procedure to form an insulating film on the side of the through hole before filling a conductive material in the through hole.

CITATION LIST

Patent Literatures

Patent Literature 1: Japanese Patent Application Laid-open No. 04-223378
Patent Literature 2: Japanese Patent Application Laid-open No. 02-051282
Patent Literature 3: Japanese Patent Application Laid-open No. 2008-294080
Patent Literature 4: Japanese Patent Application Laid-open No. 2009-88406

Non Patent Literature

Non Patent Literature 1: A. van der Heide, D. Gribenski, J. Szlufcik, Photovoltech, "INDUSTRIAL FABRICATION OF MULTI CRYSTALLINE MWT CELL WITH INTERCONNECTION FLEXIBILITY OF 16.5% EFFICIENCY" 24th European Photovoltaic Solar Energy Conference, 21-25 Sep. 2009, Hamburg, Germany, p 942-p 945

SUMMARY

Technical Problem

In light of the above process, when the concept described above as "a diameter of the through hole is large, and a large number of the through holes are formed" is considered, this concept is found to be less practical. This is because the through hole is formed by single-wafer processing using laser, and as the number of the through holes is larger, productivity is lower. Therefore, it is thought to be more practical to form a smaller number of larger through holes than forming a larger number of smaller through holes. However, in that case, another problem arises.

In the case of the MWT cell, a conductive paste is filled in the through hole, thereby arranging the front-surface electrode on the back-surface side. The paste filled in the through hole has to be held therein, and immediately hardened or fired. However, when the viscosity of the conductive paste is too high, it is difficult for the conductive paste printed from the back surface and the conductive paste printed from the front surface to come into contact with each other in the through hole. When the viscosity of the conductive paste is too low, the conductive paste cannot be held in the through hole, and therefore the resistance of the through hole is increased. Further, when the viscosity of the conductive paste is low, there is a high possibility of smearing a printing stage, thereby adversely affecting productivity.

In order to solve the problems as described above, in Patent Literature 4, when a conductive paste is filled in a through hole, a support arranged on a back surface of a substrate covers a back side of the through hole, and the paste is printed and dried to be held in the through hole. According to the method in Patent Literature 4, the conductive paste can be held in the through hole, and it is possible to reduce the resistance loss in the through hole. However, the resistivity of the conductive paste is higher than that of the same kind of metal by an order of magnitude or more. Therefore, there is a problem that even when the conductive paste is filled in the entire through hole, the resistance cannot be sufficiently decreased, and accordingly the photoelectric conversion efficiency is reduced.

In the case of the EWT cell, the problem as described above does not arise because a diffusion layer is utilized to conduct electricity in the through hole. However, when the resistivity of the diffusion layer and the resistivity of the conductive paste are compared with each other, the latter is considerably lower. Therefore, the MWT cell is assumed to obtain higher conversion efficiency. At the present time, the MWT cell is under much discussion.

The present invention has been achieved to solve the above problems, and an object of the present invention is to provide a solar cell with excellent photoelectric conversion efficiency and high productivity and a method for manufacturing the same, and a solar cell module.

Solution to Problem

The present invention is directed to a solar cell that achieves the object. The solar cell includes a first conductive type semiconductor substrate in which a through hole is formed; a second conductive type impurity diffusion layer that is provided on one-surface side of the semiconductor substrate; a light-receiving surface electrode that is provided to be electrically connected to the impurity diffusion layer on the one-surface side of the semiconductor substrate; a lead-out electrode that is led out to the other-surface side of the semiconductor substrate via the through hole, and is provided to be electrically connected to the light-receiving surface electrode; and a back-surface electrode that is electrically connected to the semiconductor substrate on the other-surface side of the semiconductor substrate, and is electrically separated from the lead-out electrode. The lead-out electrode is configured by filling a metal member made of single metal inside the through hole, and is electrically connected to the light-receiving surface electrode via the metal member.

Advantageous Effects of Invention

According to the present invention, a solar cell with excellent photoelectric conversion efficiency and high productivity can be obtained.

BRIEF DESCRIPTION OF DRAWINGS

FIG. 1-2 is a plan view of the solar cell according to the first embodiment of the present invention as viewed from a surface opposite to the light-receiving surface (a back surface).

FIG. 1-3 is a cross-sectional view of relevant parts taken along the line A-A in FIG. 1-1.

FIG. 2-1 is a perspective view of an external appearance of a metal plug that constitutes a lead-out electrode according to the first embodiment of the present invention.

FIG. 2-2 is a perspective view of an external appearance of another metal plug that constitutes the lead-out electrode according to the first embodiment of the present invention.

FIG. 3-1 is a cross-sectional view of relevant parts of the method for manufacturing the solar cell according to the first embodiment of the present invention.

FIG. 3-2 is a cross-sectional view of relevant parts of the method for manufacturing the solar cell according to the first embodiment of the present invention.

FIG. 3-3 is a cross-sectional view of relevant parts of the method for manufacturing the solar cell according to the first embodiment of the present invention.

FIG. 3-4 is a cross-sectional view of relevant parts of the method for manufacturing the solar cell according to the first embodiment of the present invention.

FIG. 3-5 is a cross-sectional view of relevant parts of the method for manufacturing the solar cell according to the first embodiment of the present invention.

FIG. 3-6 is a cross-sectional view of relevant parts of the method for manufacturing the solar cell according to the first embodiment of the present invention.

FIG. 3-7 is a cross-sectional view of relevant parts of the method for manufacturing the solar cell according to the first embodiment of the present invention.

FIG. 4 is a flowchart of the method for manufacturing the solar cell according to the first embodiment of the present invention.

FIG. 5 is a plan view of a metal plug that includes a stress release unit according to the first embodiment of the present invention.

FIG. 6 is a schematic cross-sectional view of an example of a method for connecting solar cells to each other according to the first embodiment of the present invention.

FIG. 7 is a schematic cross-sectional view of another example of the method for connecting solar cells to each other according to the first embodiment of the present invention.

FIG. 8-1 is a cross-sectional view of relevant parts of the method for manufacturing a solar cell according to a second embodiment of the present invention.

FIG. 8-2 is a cross-sectional view of relevant parts of the method for manufacturing the solar cell according to the second embodiment of the present invention.

FIG. 8-3 is a cross-sectional view of relevant parts of the method for manufacturing the solar cell according to the second embodiment of the present invention.

FIG. 8-4 is a cross-sectional view of relevant parts of the method for manufacturing the solar cell according to the second embodiment of the present invention.

FIG. 8-5 is a cross-sectional view of relevant parts of the method for manufacturing the solar cell according to the second embodiment of the present invention.

FIG. 8-6 is a cross-sectional view of relevant parts of the method for manufacturing the solar cell according to the second embodiment of the present invention.

FIG. 8-7 is a cross-sectional view of relevant parts of the method for manufacturing the solar cell according to the second embodiment of the present invention.

FIG. 8-8 is a cross-sectional view of relevant parts of the method for manufacturing the solar cell according to the second embodiment of the present invention.

FIG. 10-1 is a plan view of a conventional MWT cell as viewed from a back surface.

FIG. 10-2 is a cross-sectional view of relevant parts taken along the line B-B in FIG. 10-1, and is a cross-sectional view of relevant parts in a region where there is not a protruding portion.

FIG. 11-1 is a plan view of a solar cell according to a third embodiment of the present invention as viewed from a back surface.

FIG. 11-2 is a cross-sectional view of relevant parts taken along the line C-C in FIG. 11-1, and is a cross-sectional view of relevant parts in a region where there is not the protruding portion.

DESCRIPTION OF EMBODIMENTS

Figure 1:
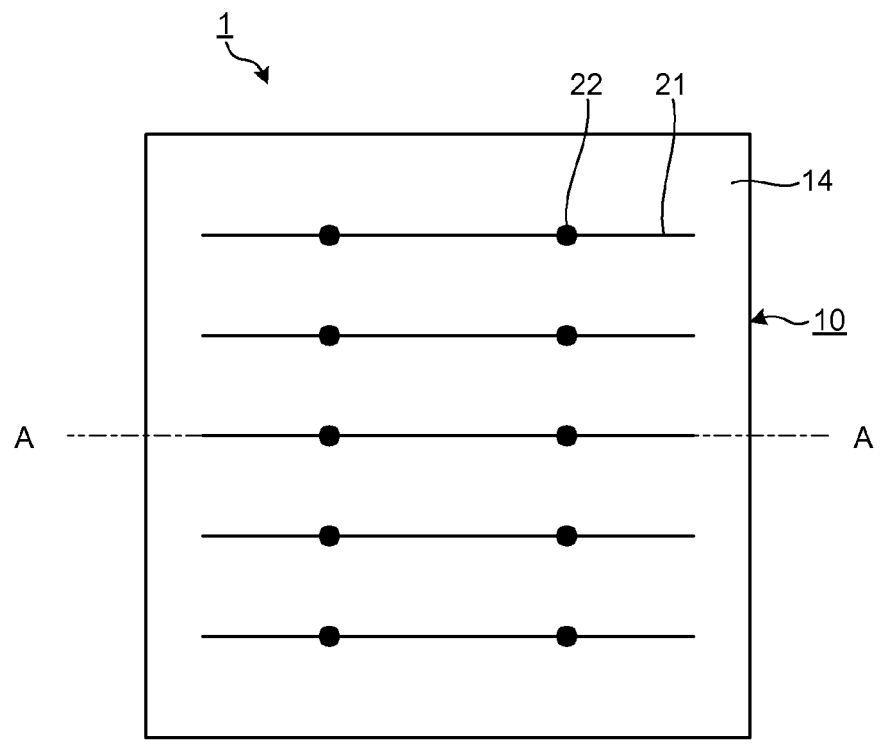
FIG. 1-1 is a plan view of a solar cell according to a first embodiment of the present invention as viewed from a light-receiving surface.

Exemplary embodiments of a solar cell and a method for manufacturing the same, and a solar cell module according to the present invention will be explained below in detail with reference to the accompanying drawings. The present invention is not limited to the following descriptions and can be modified as appropriate without departing from the scope of the invention. In addition, in the drawings explained below, for easier understanding, scales of respective members may be different from those of actual products. The same holds true for the relationships between respective drawings. Furthermore, even if the drawings are plan views, hatchings may be added for clearer viewing of the drawings.

First Embodiment

Figures 1, 2:
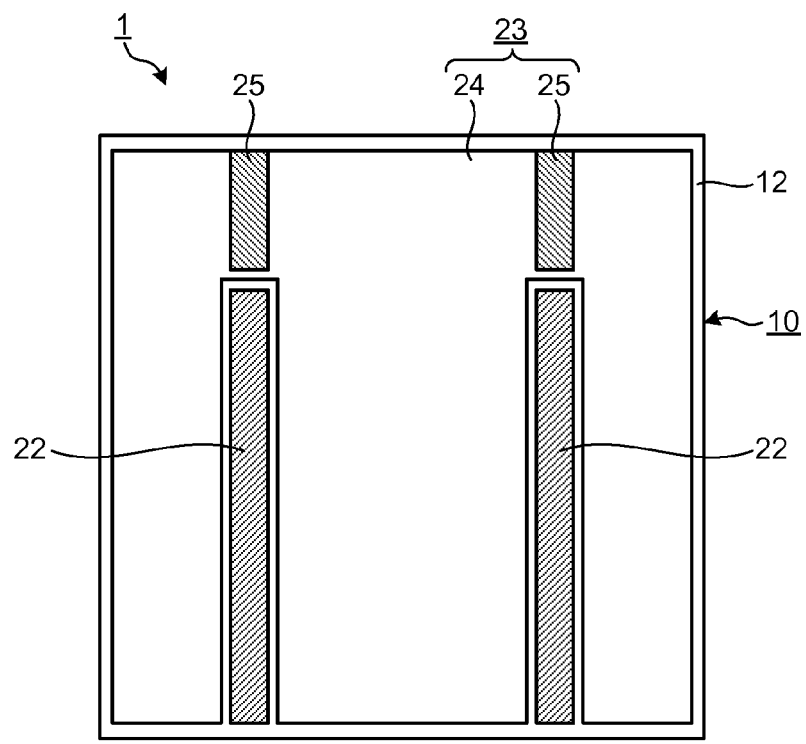
Figures 1, 2, 3:
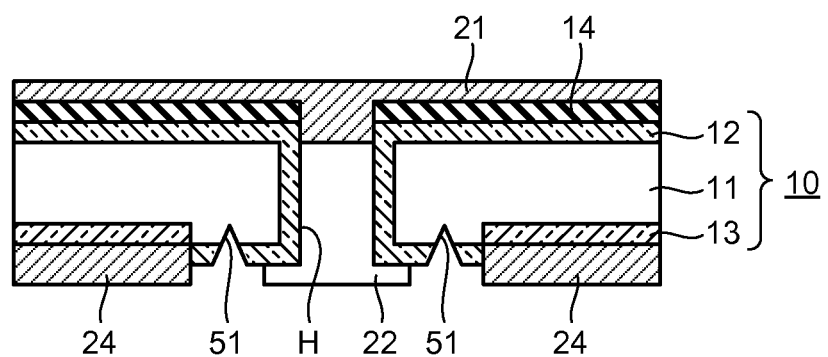
Figures 1, 2:
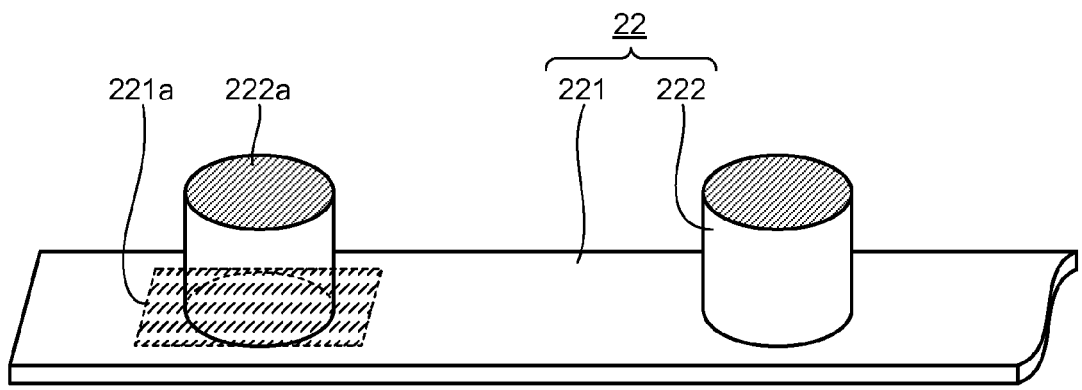
Figure 2:
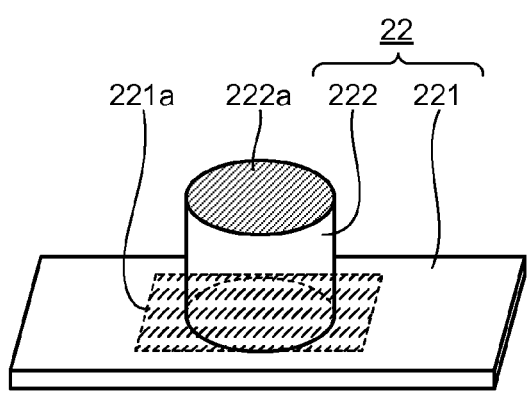

FIG. 1-1 is a plan view of a solar cell 1 according to a first embodiment of the present invention as viewed from a light-receiving surface. FIG. 1-2 is a plan view of the solar cell 1 as viewed from a surface opposite to the light-receiving surface (a back surface). FIG. 1-3 is a cross-sectional view of relevant parts taken along the line A-A in FIG. 1-1. The solar cell 1 according to the first embodiment is an MWT cell having a structure in which a front-surface electrode is led out to the back surface through a through hole.

The solar cell 1 includes an anti-reflective film 14 and a light-receiving surface electrode 21 on a light-receiving surface of an Si substrate 10 in which a plurality of through holes H are provided. The Si substrate 10 includes a p-type Si substrate 11, an n-type impurity diffusion layer 12 that is provided on a surface of the Si substrate 10 on its light-receiving-surface side and that has an n-type impurity diffused therein, and a p+layer (a back surface field (BSF) layer) 13 that is provided on a surface of the Si substrate 10 on its back-surface side and that contains a high concentration of impurity. The n-type impurity diffusion layer 12 is formed to partially extend around an inner side of the through hole H to a peripheral region of the through hole H on the back surface of the Si substrate 10.

The light-receiving surface electrode 21 is a front-surface n-electrode that electrically connects to the n-type impurity diffusion layer 12 on the light-receiving-surface side of the Si substrate 10, and is a so-called grid electrode. Because the light-receiving surface electrode 21 is formed by using a fire-through method, the anti-reflective film 14 is hardly present below the light-receiving surface electrode 21 on the light-receiving-surface side of the Si substrate 10, but is present in regions other than those below the light-receiving surface electrode 21. In FIG. 1-3, the anti-reflective film 14 is shown for reference purposes in order to represent a positional relationship with the Si substrate 10.

A lead-out electrode 22 that is a back-surface n-electrode is embedded in the through hole H on the Si substrate 10. The lead-out electrode 22 electrically connects to the light-receiving surface electrode 21, and is led out to the back-surface side of the Si substrate 10 through the through hole H. FIG. 1-1 depicts the lead-out electrode 22, while depicting the anti-reflective film 14 in a transparent manner.

FIG. 2-1 is a perspective view of an external appearance of a metal plug that is a metal member that constitutes the lead-out electrode 22. That is, the lead-out electrode 22 is configured by filling a metal plug made of single metal in the interior of the through hole H. In the metal plug, a plurality of cylindrical protruding portions 222 are provided on one surface of a flat portion 221. In a plane of the Si substrate 10, the protruding portions 222 are provided on one surface of the flat portion 221 with a predetermined spacing that is the same as the spacing between the adjacent through holes H in a direction perpendicular to the line A-A in FIG. 1-1. Each of the protruding portions 222 is filled in the through hole H, and one-surface side of the flat portion 221 is arranged in contact with the back surface (the n-type impurity diffusion layer 12) of the Si substrate 10.

The single metal is metal that does not contain any non-conductive impurity, and includes alloys. An upper surface 222a of the protruding portion 222 electrically connects to the light-receiving surface electrode 21. Therefore, it is preferable that the material of the metal plug has good joining properties with solder or an electrode material paste of the light-receiving surface electrode 21. The single metal reduces the resistivity of the lead-out electrode 22 as compared to a case where a lead-out electrode is formed from an electrode material paste including silver (Ag), glass, and the like. Therefore, it is preferable that the material of the metal plug has a low resistivity. Examples of such a material include a copper-based material mainly made of copper (Cu), a silver-based material mainly made of silver (Ag), and a nickel-based material mainly made of nickel (Ni). Among these materials, the copper-based material is inexpensive, and is therefore preferable as the material of the metal plug.

The surface of the metal plug is entirely coated by an insulating film (not shown), except a connection region 221a provided on a part of the other surface of the flat portion 221 and the upper surface 222a of the protruding portion 222. That is, the upper surface 222a of the protruding portion 222 and the connection region 221a are not coated by the insulating film. The connection region 221a is a region for electrically connecting the lead-out electrode 22 and an external member such as a solar cell to each other. A conductive tab or the like is connected to the connection region 221a through solder or a conductive adhesive. The position of the connection region 221a is flexible according to a method for electrically connecting the lead-out electrode 22 and the external member to each other. The location of the connection region 221a is not limited. It suffices that the insulating film coats at least a contact surface of the flat portion 221 with the back-surface side of the Si substrate 10.

In the metal plug shown in FIG. 2-1, the protruding portions 222 are formed on one surface of the flat portion 221, and the connection region 221a is provided on the other surface of the flat portion 221 at its end-side central portion in the longitudinal direction of the metal plug. This is one mode of the metal plug. For example, the metal plug can be in a mode in which one protruding portion 222 is formed on one surface of the flat portion 221 as shown in FIG. 2-2. FIG. 2-2 is a perspective view of an external appearance of another metal plug that constitutes the lead-out electrode 22. In the case of the metal plug as shown in FIG. 2-2, the connection regions 221a of the respective metal plugs filled in the through holes H are electrically connected to each other by a conductive tab through solder or a conductive adhesive.

The Si substrate 10 includes, on its back surface, a back-surface p-electrode 24 that has p-type conduction in the Si substrate 10 and electrically connects to the BSF layer 13, and a connecting back-surface p-electrode 25 that is provided in a predetermined region of a surface of the back-surface p-electrode 24. The back-surface p-electrode 24 is an aluminum electrode formed by printing and firing an electrode material paste mainly made of aluminum. The connecting back-surface p-electrode 25 is a silver electrode formed by printing and firing an electrode material paste mainly made of silver. The back-surface p-electrode 24 and the connecting back-surface p-electrode 25 constitute a p-electrode 23. The back-surface p-electrode 24 and the lead-out electrode 22 are electrically separated by a pn separating groove 51 that extends from the surface of the n-type impurity diffusion layer 12, which extends around to the back surface of the Si substrate 10, to the interior of the Si substrate 11.

FIG. 1-1 is an example in which five light-receiving surface electrodes 21 are provided for easy understanding. However, a larger number of light-receiving surface electrodes 21 are actually provided. Further in FIG. 1-1, two lead-out electrodes 22 are provided for each of the light-receiving surface electrodes 21. However, correspondence between the number of the light-receiving surface electrodes 21 and the number of the lead-out electrodes 22 is flexible according to the number of the light-receiving surface electrodes 21 or the like, and the number of the lead-out electrodes 22 to be provided is not limited. That is, a mode in which one lead-out electrode 22 is provided for ten light-receiving surface electrodes 21 can be adopted, for example.

Figures 1, 3:
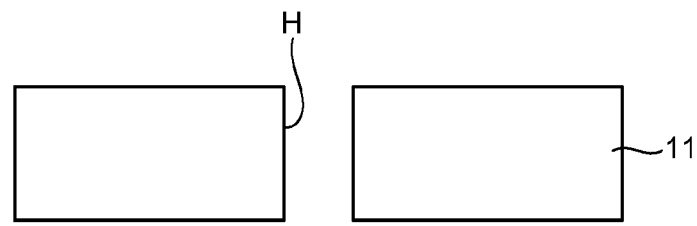
Figures 2, 3:
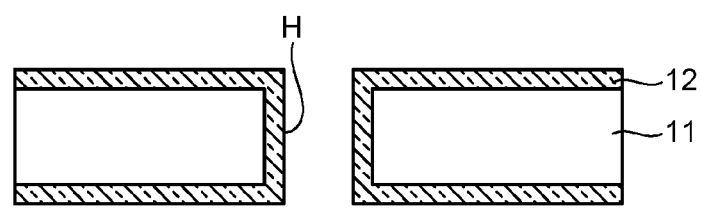
Figure 3:
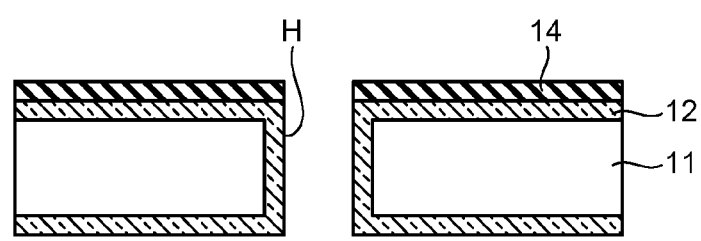
Figures 3, 4:
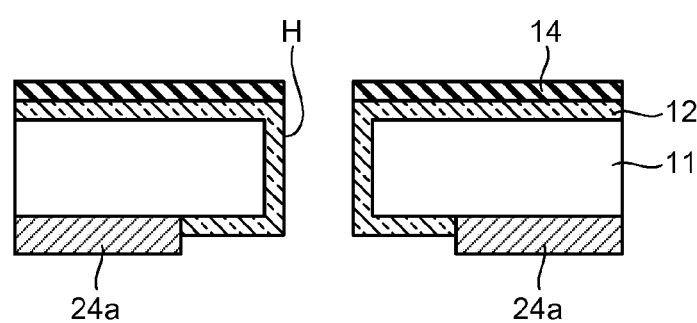

Next, a method for manufacturing the solar cell 1 according to the first embodiment is explained with reference to FIGS. 3-1 to 3-7, and FIG. 4. FIGS. 3-1 to 3-7 are cross-sectional views of relevant parts of the method for manufacturing the solar cell 1 according to the first embodiment. FIG. 4 is a flowchart of the method for manufacturing the solar cell 1 according to the first embodiment. A p-type Si substrate is assumed to be used in this manufacturing method. However, even when an n-type Si substrate is employed, the same solar cell can also be produced by changing a diffusion material to an appropriate diffusion material.

First, a cylindrical through hole H is formed at a predetermined position on the p-type Si substrate 11 (hereinafter, also "substrate 11") (FIG. 3-1, Step S10). The method for forming the through hole H is not particularly limited. It is possible to form the through hole H by using laser, for example. Further, the shape of the through hole H is not particularly limited. From the viewpoint of productivity, in a case where the through hole H is formed by using laser, it is more advantageous to form a smaller number of larger-diameter through holes H than forming a larger number of smaller-diameter through holes H.

Fine recesses and projections referred to as "texture" are then formed on the surface of the substrate 11, and a damaged layer in a peripheral portion of the through hole H is removed (Step S20). The texture reduces the surface reflectivity of a solar cell, and high photoelectric conversion efficiency can be obtained. It is common to use wet etching for forming a texture in a crystalline Si solar cell. At the time of forming the texture by wet etching, damage caused by substrate slicing is removed, and the damaged layer in the peripheral portion of the through hole H, which results from the laser at the time of forming the through hole H, is also removed. Even in a case where the texture is formed by dry etching, a step of removing slice damage by alkali is performed before forming the texture. At this step, a damaged layer in a peripheral portion of a through hole is removed.

The substrate 11 is then heated in a gaseous atmosphere of $POCl_3$, thereby forming the n-type impurity diffusion layer 12 (hereinafter, also "diffusion layer 12") in which P is diffused on the surface of the substrate 11 to form a semiconductor pn junction. On the surface of the substrate 11 immediately after the diffusion layer 12 is formed thereon, a layer of glass (phospho-silicate glass (PSG)), which has been deposited thereon during the diffusion processing, is formed. Therefore, the substrate 11 is soaked in hydrofluoric acid or the like to remove the PSG layer by etching (FIG. 3-2, Step S30). The diffusion layer 12 can also be formed by using an SOD.

Next, a PECVD method is used, for example, to form an SiN film (a PECVD-SiN film) on the light-receiving-surface side of the substrate 11 as the anti-reflective film 14 (FIG. 3-3, Step S40). When the substrate 11 is a single-crystal Si substrate, an alternative is to use a silicon thermally-oxidized film ($SiO_2$) as the anti-reflective film 14. Further, when P-doped titanium dioxide ($TiO_2$) is used as the SOD, a process of forming the anti-reflective film 14 simultaneously with forming the diffusion layer 12 is also possible.

The p-electrode 23 is then printed. On the back-surface side of the substrate 11, as the p-electrode 23, an aluminum paste 24a that is an electrode material paste is applied into a shape of the back-surface p-electrode 24, and further a silver paste that is an electrode material paste is applied into a shape of the connecting back-surface p-electrode 25, both by screen printing, for example. The aluminum paste 24a and the silver paste are then dried (FIG. 3-4, Step S50). FIG. 3-4 only depicts the aluminum paste 24a.

Figures 3, 4, 5:
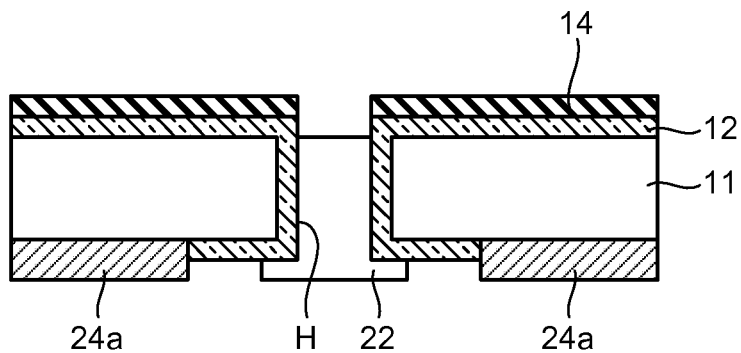

The metal plug that serves as the lead-out electrode 22 is then inserted from the back-surface side of the substrate 11 and located thereon in order that the protruding portion 222 fits in the through hole H (FIG. 3-5, Step S60). Next, on the light-receiving-surface side of the substrate 11, a silver paste 21a that is an electrode material paste is applied into a shape of the light-receiving surface electrode 21 that is a front-surface n-electrode by screen printing, for example. The silver paste 21a is then dried (FIG. 3-6, Step S70). The silver paste 21a is applied to be embedded in an upper portion of the through hole H in order to come into contact with the metal plug in the through hole H.

Because the through hole H is covered by the metal plug, the silver paste 21a is prevented from leaking through the through hole H and smearing a printing stage. Further, because the flat portion 221 provided in the metal plug is equivalent to a back-surface n-electrode that is conventionally formed by printing, a step of printing the back-surface n-electrode, which is conventionally required, can be omitted.

The electrode pastes on the front surface and back surface of the substrate 11 are then fired simultaneously at a temperature of approximately 600° C. to 900° C., for example. Therefore, on the front-surface side of the substrate 11, while the anti-reflective film 14 is melted by a glass material included in the silver paste 21a, a silver material comes into contact with silicon and solidifies again. In this manner, the light-receiving surface electrode 21 is obtained, thereby ensuring conduction between the light-receiving surface electrode 21 and the silicon of the substrate 11. In the through hole H, the silver material included in the silver paste 21a comes into contact with the metal plug and solidifies again. In this manner, the light-receiving surface electrode 21 is electrically and mechanically connected to the lead-out electrode 22 (Step S80).

As described above, an electrical connection between the light-receiving surface electrode 21 and the metal plug is obtained by a conductive paste. Therefore, when an upper surface of the protruding portion 222 in the metal plug is roughened, the conductive paste is more strongly connected to the protruding portion 222. It is assumed that when the metal plug, in which the protruding portions 222 are formed on the flat portion 221, is used, a thermal stress is applied to the flat portion 221 (between the adjacent protruding portions 222) at the time of firing due to a difference in thermal expansion coefficient between the substrate 11 and the metal plug, and the metal plug is deformed. Therefore, as shown in FIG. 5, a stress release unit 223 that is a stress release structure that releases a stress applied to the flat portion 221 (between the adjacent protruding portions 222) can be provided in the flat portion 221 (between the adjacent protruding portions 222), thereby eliminating deformation of the metal plug. FIG. 5 is a plan view of a metal plug that includes the stress release unit 223.

The aluminum paste 24a reacts with silicon of the substrate 11, thereby obtaining the back-surface p-electrode 24, and also forming the BSF layer 13 immediately below the back-surface p-electrode 24. In this manner, the Si substrate 10 that includes the p-type Si substrate 11, the n-type impurity diffusion layer 12, and the BSF layer 13 is obtained. Further, the silver material in the silver paste 21a comes into contact with aluminum and solidifies again, thereby obtaining the connecting back-surface p-electrode 25 (FIG. 3-7). FIG. 3-7 only depicts the light-receiving surface electrode 21, the lead-out electrode 22, and the back-surface p-electrode 24.

Next, isolation is performed by laser (FIG. 3-7, Step S90). That is, the pn separating groove 51 that extends from the surface of the diffusion layer 12, which extends around to the back surface of the Si substrate 10, to the interior of the Si substrate 11 is formed by the laser to electrically separate the back-surface p-electrode 24 from the lead-out electrode 22. After undergoing the above steps, the solar cell 1 according to the first embodiment is completed.

Figures 3, 4, 5, 6:
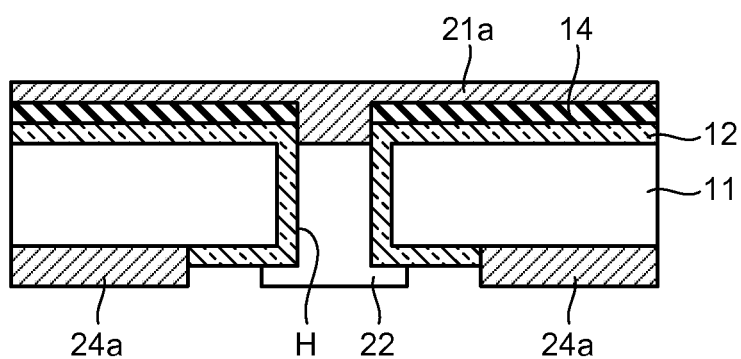

Thereafter, a plurality of the solar cells 1 are electrically connected to each other in series (or in parallel) to produce a solar cell module. FIG. 6 is a schematic cross-sectional view of an example of a method for connecting the solar cells 1 to each other. FIG. 6 depicts a cross section of the Si substrate 10 in a direction perpendicular to the line A-A in FIG. 1-1 in the plane of the Si substrate 10. As shown in FIG. 6, there is a case where the entire surface of the lead-out electrode 22, except the upper surface 222a of the protruding portion 222 and the connection region 221a, is coated by an insulating film 224, and the solar cells 1 are connected to each other by an additional member such as a solder paste 31 and a conductive tab 32. In this case, the workability is better when the connection region 221a of the metal plug is provided on the other surface of the flat portion 221 (a surface on which the protruding portion 222 is not located). Further, the back-surface p-electrode 24 can be formed on the substantially entire back surface of the Si substrate 10, except the through hole H. In this case, the back-surface p-electrode 24 is only an electrode that comes into contact with the back surface of the Si substrate 10. Therefore, the area of a BSF layer can be kept large. Accordingly, there is an advantage in that a decrease in open circuit voltage due to recombination of carriers generated in the Si substrate 10 hardly occurs, and a high open circuit voltage is obtained. In this mode, a pn separating groove is not necessary.

Figures 3, 4, 5, 6, 7:
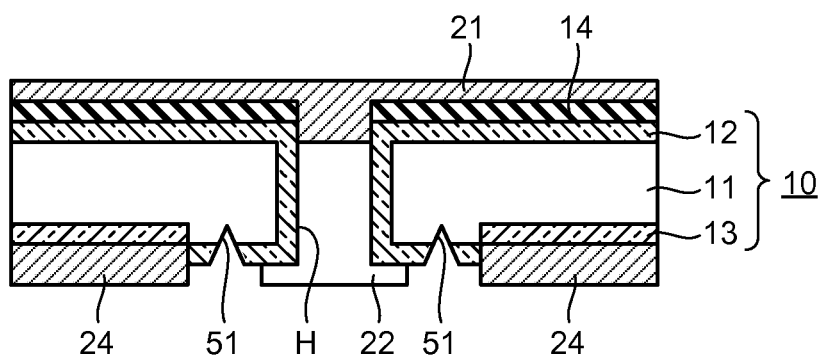
Figure 5:
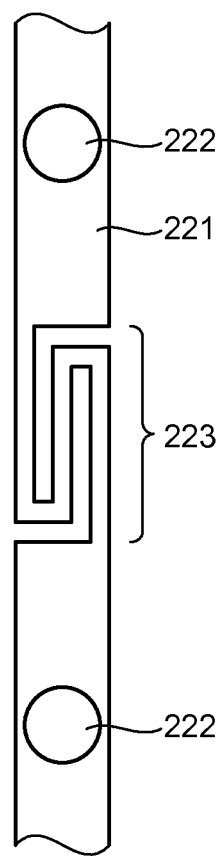
Figure 6:
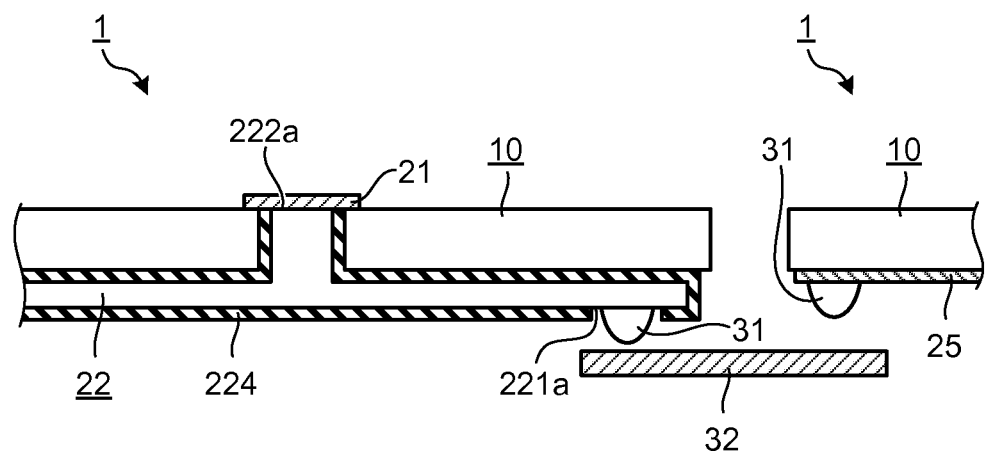
Figure 7:
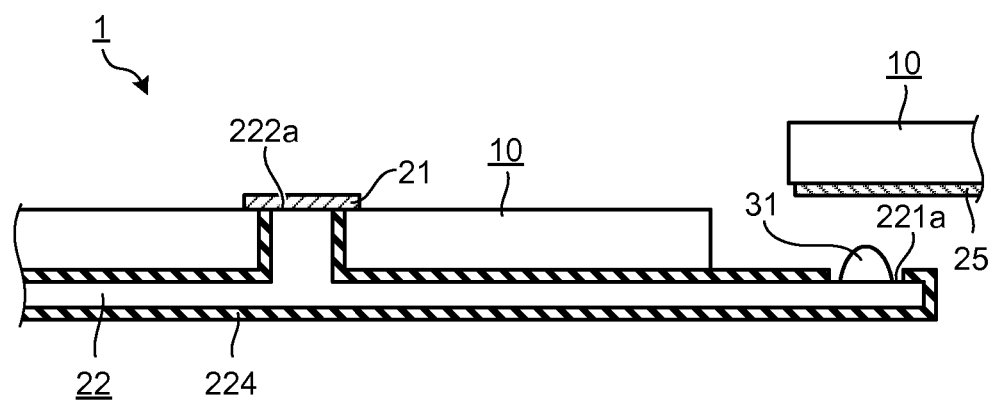

FIG. 7 is a schematic cross-sectional view of another example of the method for connecting the solar cells 1 to each other. FIG. 7 depicts a cross section of the Si substrate 10 in a direction perpendicular to the line A-A in FIG. 1-1 in the plane of the Si substrate 10. As shown in FIG. 7, in a case where the flat portion 221 of the metal plug extends outward from the solar cell 1 to connect the solar cells 1 to each other, the workability is better when the connection region 221a is provided on one surface of the flat portion 221 (a surface on which the protruding portion 222 is located). Further, the back-surface p-electrode 24 can be formed on the substantially entire back surface of the Si substrate 10, except the through hole H. In this case, the back-surface p-electrode 24 is only an electrode that comes into contact with the back surface of the Si substrate 10. Therefore, the area of a BSF layer can be kept large. Accordingly, there is an advantage in that a decrease in open circuit voltage due to recombination of carriers generated in the Si substrate 10 hardly occurs, and a high open circuit voltage is obtained. In this mode, a pn separating groove is not necessary.

The arrangement position of the connection region 221a in the metal plug is flexible appropriately according to the method for connecting the solar cells 1 to each other. Furthermore, a conductive adhesive can also be used instead of the solder paste 31. Further, FIGS. 6 and 7 focus on a connection method of the lead-out electrode 22, and omit some part of members of the solar cell 1.

In the first embodiment, a metal plug made of single metal is arranged in the through hole H, and the light-receiving surface electrode 21 is led out through the metal plug and located on the back surface of the substrate 11. Because a conductive paste is typically made of a metal particle, an organic component, glass frit, and the like, the resistivity of the conductive paste is higher than that made of single metal by an order of magnitude or more. Therefore, an electrode in the through hole H, which is conventionally formed by filling a conductive paste therein, is made of single metal. Accordingly, the resistance loss in the through hole H can be reduced, and a solar cell with high photoelectric conversion efficiency can be achieved.

In the first embodiment, because the metal plug is arranged in the through hole H, it is not necessary to fill a conductive paste in the through hole H in its entirety at the time of forming the light-receiving surface electrode 21. Therefore, the conductive paste is easily printed. Further, because the conductive paste is printed with the metal plug arranged in the through hole H, a printing stage is prevented from being smeared at the time of printing, and accordingly productivity can be improved.

Therefore, according to the first embodiment, a solar cell with a low resistance of the lead-out electrode 22, excellent photoelectric conversion efficiency, and high productivity is obtained.

In the above descriptions, the metal plug is held by only an adhesive force of a conductive paste used for forming the light-receiving surface electrode 21. There is a possibility of a problem arising in that the metal plug cannot support its own-weight depending on the diameter of the protruding portion 222. In this case, it is possible to deal with the problem by applying an adhesive to a part of the flat portion 221, except the stress release unit 223, to fix the metal plug to the Si substrate 10.

Second Embodiment

Figures 1, 8:
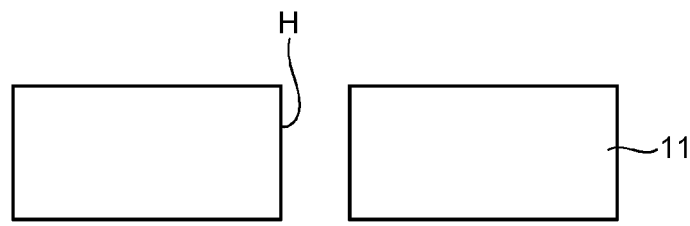
Figures 2, 8:
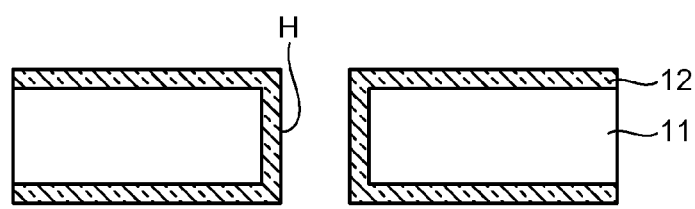
Figures 3, 8:
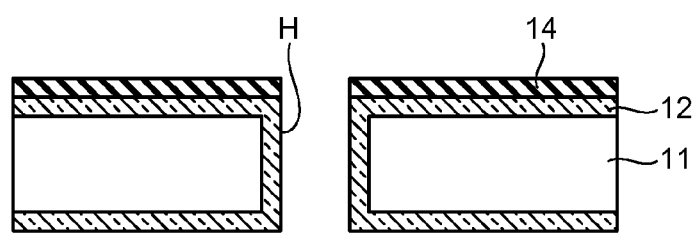
Figures 4, 8:
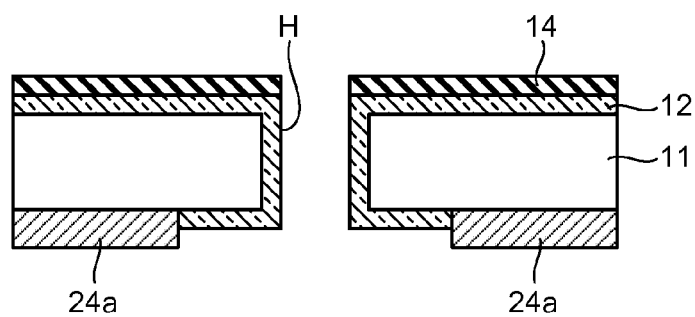
Figures 5, 8:
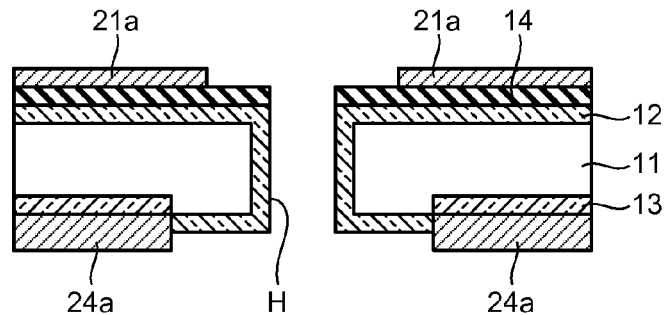
Figures 6, 8:
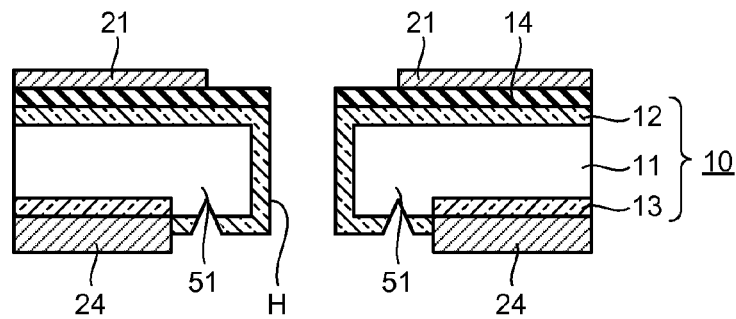
Figures 7, 8:
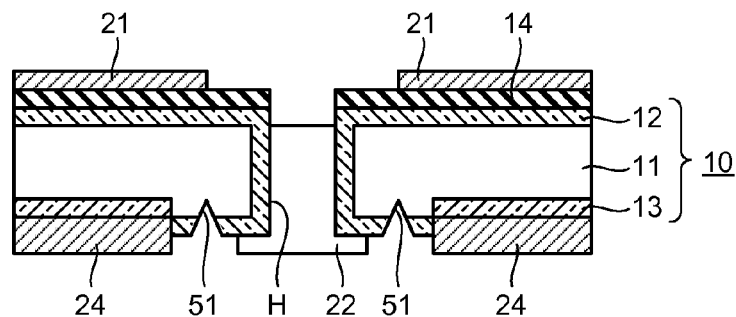
Figure 8:
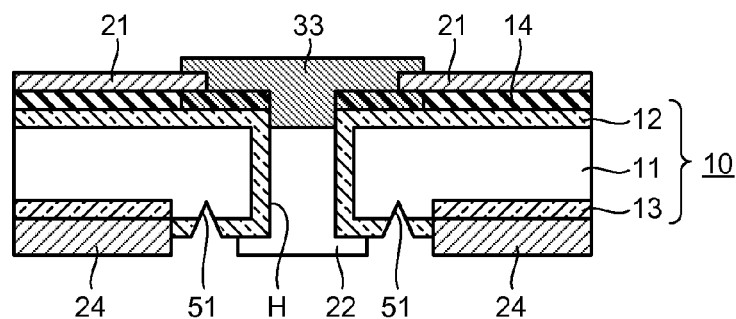
Figure 9:
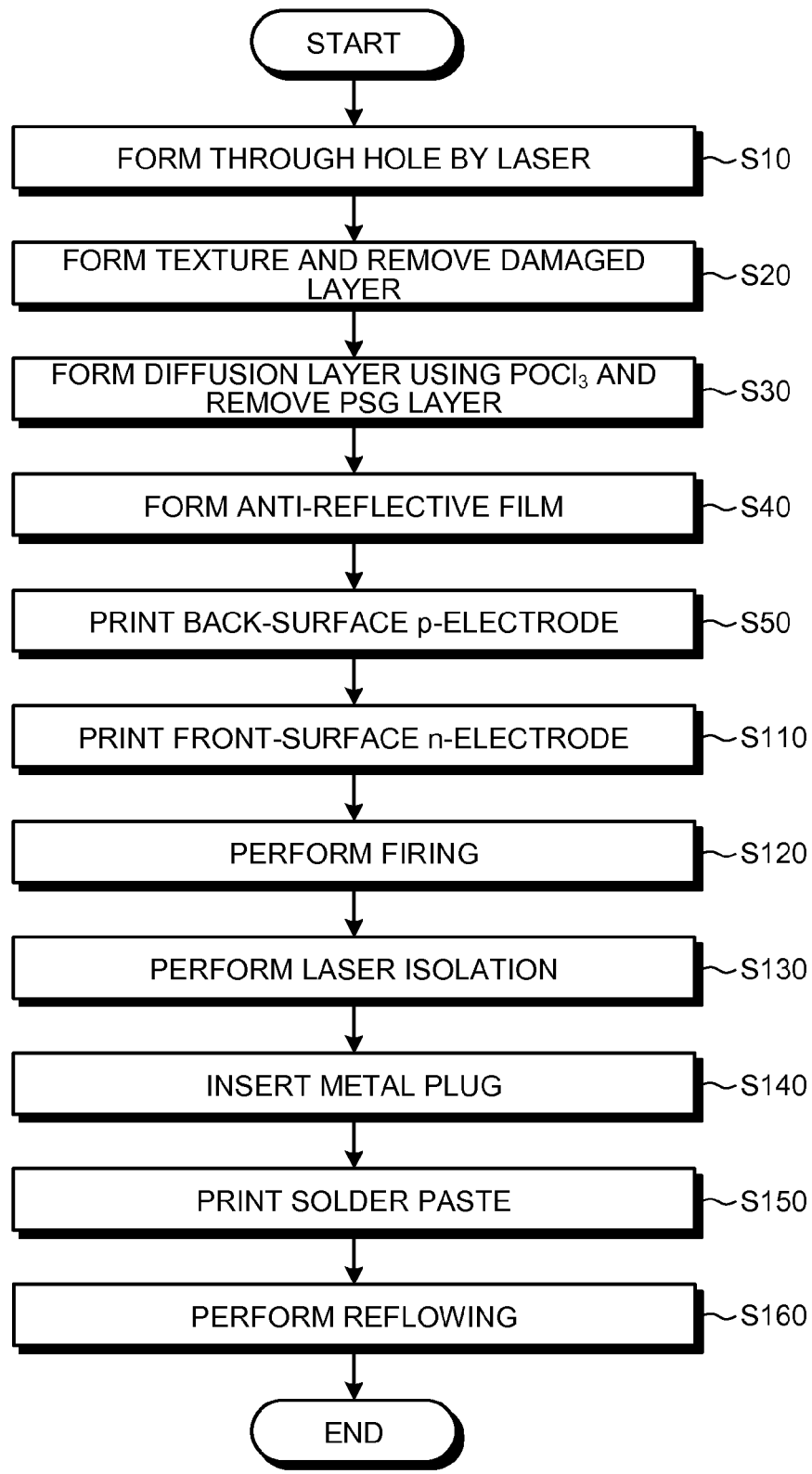
FIG. 9 is a flowchart of the method for manufacturing the solar cell according to the second embodiment of the present invention.

In the first embodiment, an electrical connection between the light-receiving surface electrode 21 and the metal plug is obtained by a conductive paste. However, this electrical connection can also be obtained by printing and reflowing a solder paste. A method for manufacturing a solar cell according to a second embodiment is explained below with reference to FIGS. 8-1 to 8-8, and FIG. 9. FIGS. 8-1 to 8-8 are cross-sectional views of relevant parts of the method for manufacturing the solar cell according to the second embodiment. FIG. 9 is a flowchart of the method for manufacturing the solar cell according to the second embodiment. In FIGS. 8-1 to 8-8, members identical to those shown in FIGS. 3-1 to 3-7 are denoted by like reference signs.

In the method for manufacturing the solar cell according to the second embodiment, a process of applying the aluminum paste 24a from Steps S10 to S50 shown in FIGS. 8-1 to 8-4 is the same as the process shown in FIGS. 3-1 to 3-4, and FIG. 4. However, the aluminum paste 24a that serves as the back-surface p-electrode 24 is applied to the substantially entire back surface of the Si substrate 10 except the through hole H. Formation of the connecting back-surface p-electrode 25 is not explained here.

After the aluminum paste 24a is applied, on the light-receiving-surface side of the substrate 11, the silver paste 21a that is an electrode material paste is applied into a shape of the light-receiving surface electrode 21 that is a front-surface n-electrode by screen printing, for example. The silver paste 21a is then dried (FIG. 8-5, Step S110). At this time, the silver paste 21a is applied on the light-receiving-surface side of the substrate 11, except a peripheral region of the through hole H.

The electrode pastes on the front surface and back surface of the substrate 11 are then fired simultaneously (FIG. 8-6, Step S120). Therefore, on the front-surface side of the substrate 11, while the anti-reflective film 14 is melted by a glass material included in the silver paste 21a, a silver material comes into contact with silicon and solidifies again. In this manner, the light-receiving surface electrode 21 is obtained, thereby ensuring conduction between the light-receiving surface electrode 21 and the silicon of the substrate 11. At this stage, the light-receiving surface electrode 21 is divided at the position of the through hole H.

The aluminum paste 24a reacts with silicon of the substrate 11, thereby obtaining the back-surface p-electrode 24, and also forming the BSF layer 13 immediately below the back-surface p-electrode 24. In this manner, the Si substrate 10 that includes the p-type Si substrate 11, the n-type impurity diffusion layer 12, and the BSF layer 13 is obtained. The back-surface p-electrode 24 is formed on the substantially entire back surface of the Si substrate 10, except a peripheral region of the through hole H.

Next, isolation is performed by laser (FIG. 8-6, Step S130). That is, the pn separating groove 51 that extends from the surface of the diffusion layer 12, which extends around to the back surface of the Si substrate 10, to the interior of the Si substrate 11 is formed by the laser to electrically separate the back-surface p-electrode 24 from the lead-out electrode 22 to be formed later.

The metal plug that serves as the lead-out electrode 22 is then inserted from the back-surface side of the substrate 11 and located thereon in order that the protruding portion 222 fits in the through hole H (FIG. 8-7, Step S140). Next, by printing a solder paste in the through hole H and its periphery (a region where the light-receiving surface electrode 21 is not formed) on the front surface of the substrate 11 (Step S150), and reflowing the solder paste, the light-receiving surface electrode 21 is electrically and mechanically connected to the metal plug by a solder 33 (FIG. 8-8, Step S160). After undergoing the above steps, the solar cell according to the second embodiment is completed.

Also in the second embodiment, an electrode in the through hole H is made of single metal, thereby obtaining a solar cell with a low resistance of the lead-out electrode 22 and excellent photoelectric conversion efficiency, similarly to the first embodiment.

Further, it is not necessary to fill a conductive paste in the through hole H at the time of forming the light-receiving surface electrode 21. Therefore, the conductive paste is easily printed. Further, a printing stage is prevented from being smeared with the conductive paste at the time of printing, and accordingly productivity can be improved.

Third Embodiment

Figures 1, 10:
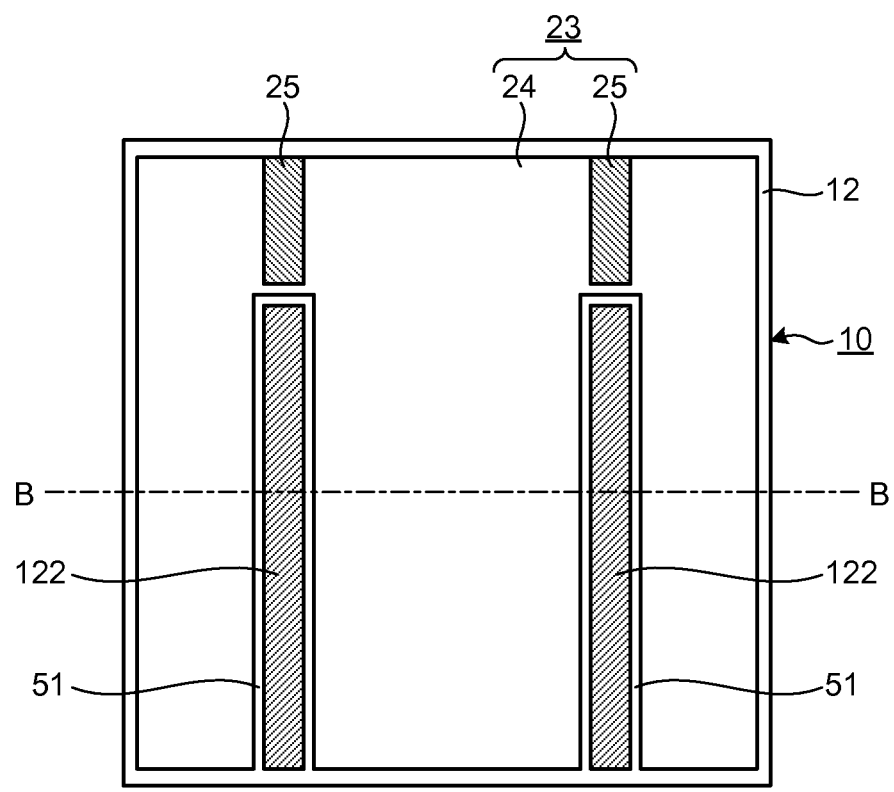
Figures 2, 10:
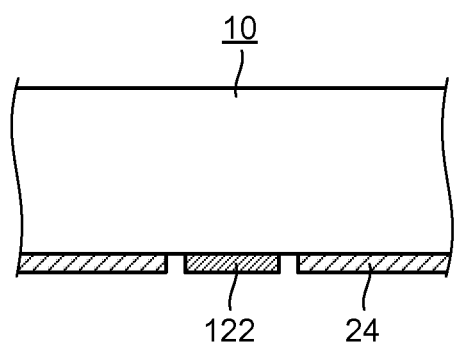
Figures 1, 11:
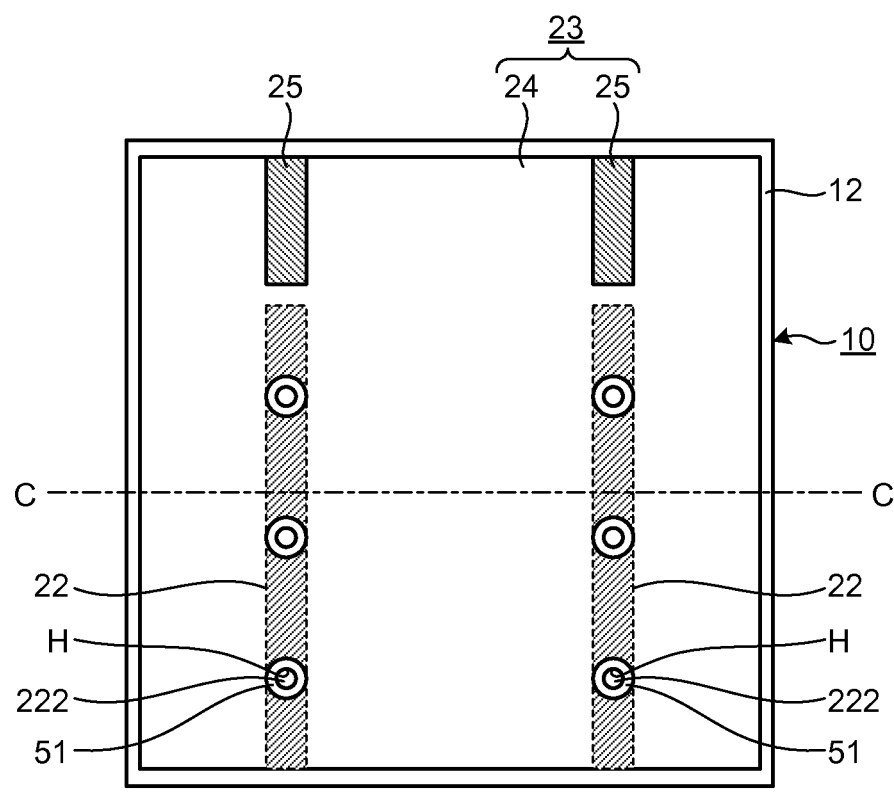
Figures 2, 11:
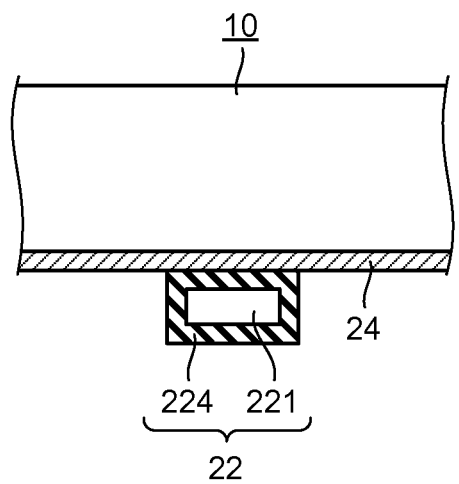

FIG. 10-1 is a plan view of a conventional MWT cell as viewed from a back surface. FIG. 10-2 is a cross-sectional view of relevant parts taken along the line B-B in FIG. 10-1, and is a cross-sectional view of relevant parts in a region where there is not the through hole H. FIG. 11-1 is a plan view of a solar cell according to a third embodiment as viewed from a back surface. FIG. 11-2 is a cross-sectional view of relevant parts taken along the line C-C in FIG. 11-1, and is a cross-sectional view of relevant parts in a region where there is not the through hole H. In the solar cell according to the third embodiment, the flat portion 221 of the metal plug that is the lead-out electrode 22 is coated by the insulating film 224. FIG. 11-1 depicts the flat portion 221 and the insulating film 224 of the lead-out electrode 22 in a transparent manner.

As shown in FIGS. 10-1 and 10-2, in the conventional MWT cell, the back-surface p-electrode 24 is not supposed to be formed in a region where a back-surface n-electrode 122 is formed in order not to cause a short circuit between electrodes.

On the other hand, in the solar cell according to the third embodiment as shown in FIGS. 11-1 and 11-2, the flat portion 221 of the metal plug that is the lead-out electrode 22 equivalent to the back-surface n-electrode 122 of the conventional MWT cell is coated by the insulating film 224. Therefore, as shown in FIGS. 11-1 and 11-2, there is no disadvantage in that the flat portion 221 of the metal plug is arranged on the back-surface p-electrode 24, and a short circuit does not occur between electrodes. In this case, isolation is performed only in a peripheral portion of the through hole H on the back-surface side of the Si substrate 10. That is, as shown in FIG. 11-1, the pn separating groove 51 is formed only in the peripheral portion of the through hole H on the back-surface side of the Si substrate 10.

In an electrode structure of the conventional MWT cell as shown in FIGS. 10-1 and 10-2, both a back-surface n-electrode and a back-surface p-electrode come into contact with the back surface of the Si substrate 10. Therefore, a BSF layer is not formed immediately below a region where the back-surface p-electrode 24 is not formed, and the BSF layer is not formed on the entire back surface of the Si substrate 10. Accordingly, it is highly probable that carriers generated in the Si substrate 10 recombine before the carriers reach their respective electrodes. Consequently, there is a problem that an open circuit voltage is generally lower than that of a general solar cell as shown in FIG. 12.

Figure 12:
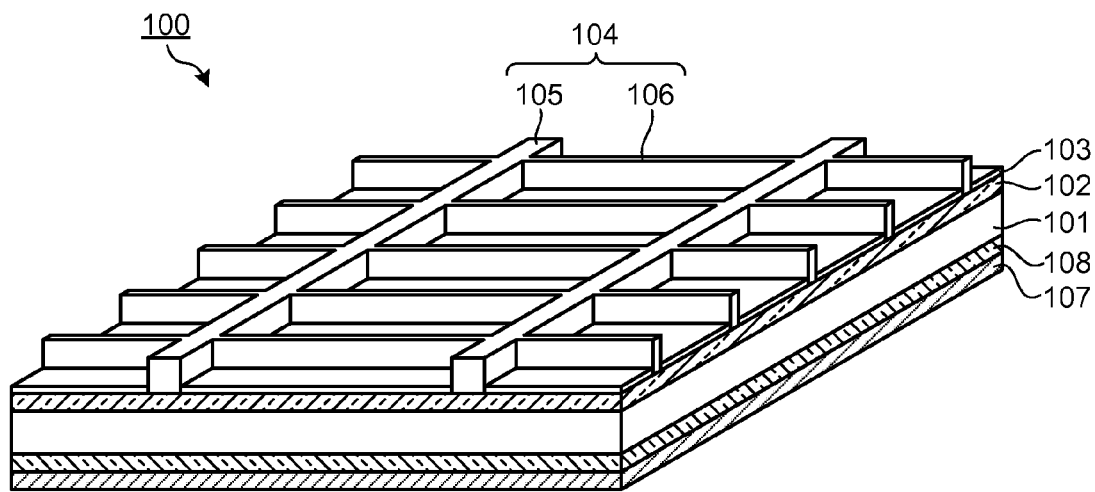
FIG. 12 is a perspective view of a schematic configuration of a conventional general solar cell.

FIG. 12 is a perspective view of a schematic configuration of a conventional general solar cell. A solar cell 100 shown in FIG. 12 includes a photoelectric conversion unit that has a pn junction formed therein. The pn junction is formed by a p-type Si substrate 101 and an n-type impurity diffusion layer 102 that is provided on a surface of the p-type Si substrate 101 on its light-receiving-surface side and that has an n-type impurity diffused therein. The solar cell 100 includes an anti-reflective film 103 and a comb-shaped light-receiving surface electrode 104 on the n-type impurity diffusion layer 102. The light-receiving surface electrode 104 is configured by a bus electrode 105 and a grid electrode 106. The solar cell 100 also includes a back-surface electrode 107 on the entire back surface of the p-type Si substrate 101. A BSF layer 108 is provided on a surface of the p-type Si substrate 101 on its back-surface side covered by the back-surface electrode 107.

Meanwhile, in the solar cell according to the third embodiment, only the back-surface p-electrode 24 comes into contact with the back surface of the Si substrate 10, and therefore the area of a BSF layer can be kept large. Accordingly, there is an advantage in that a decrease in open circuit voltage due to recombination of carriers generated in the Si substrate 10 hardly occurs, and a high open circuit voltage is obtained.

In the solar cell according to the first embodiment shown in FIGS. 1-1 to 1-3, there is a linear region in a periphery of the lead-out electrode 22, where the back-surface p-electrode 24 is not formed, similarly to the case in FIGS. 10-1 and 10-2. On the back surface of the Si substrate 10, the BSF layer 13 is not formed immediately below the region where the back-surface p-electrode 24 is not formed. There is a concern regarding the influence of the recombination of the carriers in this region. Therefore, the solar cell according to the third embodiment has a larger effect in suppressing a decrease in open circuit voltage due to the recombination of the carriers than the solar cell according to the first embodiment.

Also in the third embodiment, an electrode in the through hole H is made of single metal, thereby obtaining a solar cell with a low resistance of the lead-out electrode 22 and excellent photoelectric conversion efficiency, similarly to the first embodiment.

The solar cell according to the third embodiment can keep the area of a BSF layer large and obtains a high open circuit voltage.

Fourth Embodiment

Figure 13:
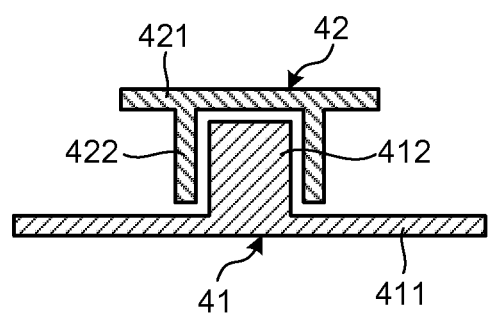
FIG. 13 is a cross-sectional view of a mode of a metal plug according to a fourth embodiment of the present invention.

While a metal plug is formed by one conductor in the first to third embodiments, the metal plug can be configured by two members. FIG. 13 is a cross-sectional view depicting a mode of a metal plug according to a fourth embodiment. The metal plug shown in FIG. 13 is constituted by a pair of a male member 41 and a female member 42. The male member 41 has the same configuration as the metal plug according to the first to third embodiments, and includes a flat portion 411 and a protruding portion 412. In the male member 41, at least a contact surface of the flat portion 411 with the back-surface side of the Si substrate 10 is coated by an insulating film. The female member 42 includes a wing portion 421 and a cylindrical protruding portion 422. An outer diameter of the protruding portion 422 is substantially equal to a diameter of the thorough hole H. An inner diameter of the protruding portion 422 is substantially equal to an outer diameter of the protruding portion 412.

Figure 14:
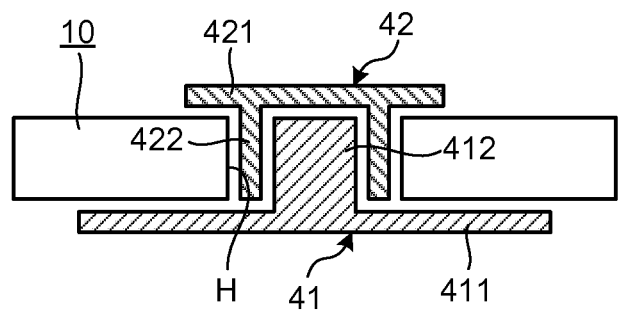
FIG. 14 is a cross-sectional view of relevant parts, depicting an arrangement relationship between a metal plug and an Si substrate according to the fourth embodiment of the present invention.

As shown in FIG. 14, the Si substrate 10 is sandwiched between the wing portion 421 of the female member 42 and the flat portion 411 of the male member 41, thereby fixing the metal plug and the Si substrate 10. Therefore, the metal plug can hardly come off the Si substrate 10. FIG. 14 is a cross-sectional view of relevant parts depicting an arrangement relationship between the Si substrate 10 and the metal plug according to the fourth embodiment. FIG. 14 focuses on a connection method of the metal plug, and omits some part of members of the solar cell 1.

In a case where the metal plug as described above is used, the female member 42 is inserted into the through hole H from the light-receiving-surface side in the process in FIG. 8-7 according to the second embodiment. By printing a solder paste in the through hole H and its periphery (a region where the light-receiving surface electrode 21 is not formed) on the front surface of the substrate 11, and reflowing the solder paste, the light-receiving surface electrode 21 is electrically and mechanically connected to the female member 42 by a solder.

Next, the male member 41 is inserted into the through hole H from the light-receiving-surface side to electrically and mechanically connect the male member 41 and the female member 42. An adhesive can be applied to a part of the flat portion 411 to fix the metal plug to the substrate 11.

Also in the fourth embodiment, an electrode in the through hole H is made of single metal, thereby obtaining a solar cell with a low resistance of the lead-out electrode 22 and excellent photoelectric conversion efficiency, similarly to the first embodiment.

Further, it is not necessary to fill a conductive paste in the through hole H at the time of forming the light-receiving surface electrode 21. Therefore, the conductive paste is easily printed. Further, a printing stage is prevented from being smeared with the conductive paste at the time of printing, and accordingly productivity can be improved.

INDUSTRIAL APPLICABILITY

As described above, the solar cell according to the present invention is useful for realizing an MWT solar cell with excellent photoelectric conversion efficiency and high productivity.

REFERENCE SIGNS LIST 1 solar cell
10 Si substrate
11 Si substrate (substrate)
12 n-type impurity diffusion layer
13 p+layer (BSF layer)
14 anti-reflective film
21 light-receiving surface electrode
21a silver paste
22 lead-out electrode
23 p-electrode
24 back-surface p-electrode
24a aluminum paste
25 connecting back-surface p-electrode
31 solder paste
32 tab
33 solder
41 male member
42 female member
51 pn separating groove
100 solar cell
101 Si substrate
102 n-type impurity diffusion layer
103 anti-reflective film
104 light-receiving surface electrode
105 bus electrode
106 grid electrode
107 back-surface electrode
108 BSF layer
122 back-surface n-electrode
221 flat portion
221a connection region
222a upper surface of protruding portion
222 protruding portion
223 stress release unit
224 insulating film
411 flat portion
412 protruding portion
421 wing portion
422 protruding portion

The invention claimed is:
1. A solar cell comprising:
a first conductive type semiconductor substrate in which a through hole is formed, the first conductive type semiconductor substrate possessing a one-surface side and an other-surface side;
a second conductive type impurity diffusion layer that is provided on the one-surface side of the semiconductor substrate;
a light-receiving surface electrode that is provided to be electrically connected to the impurity diffusion layer on the one-surface side of the semiconductor substrate;
a lead-out electrode that is led out to the other-surface side of the semiconductor substrate via the through hole, and is provided to be electrically connected to the light-receiving surface electrode; and a back-surface electrode that is electrically connected to the semiconductor substrate on the other-surface side of the semiconductor substrate, and is electrically separated from the lead-out electrode, wherein the lead-out electrode is formed by a metal member that is constituted by a pair of a male member and a female member, the male member and the female member being connected via the through hole, wherein a protruding portion of the male member is configured to fit in a cylindrical protruding portion of the female member, and the male member and the female member sandwich the semiconductor substrate, thereby fixing the metal member and the semiconductor substrate.

2. The solar cell according to claim 1, wherein the protruding portion of the male member is located on one surface of a flat portion, and wherein the protruding portion of the male member is inserted in the through hole, and a one-surface side of the flat portion contacts the other-surface side of the semiconductor substrate.

3. The solar cell according to claim 2, wherein the lead-out electrode is (i) configured by inserting the metal member including only a single metal inside the through hole, the metal being copper, and (ii) electrically connected to the light-receiving surface electrode via a conductive material.

4. The solar cell according to claim 2, wherein the lead-out electrode is (i) configured by inserting the metal member including only a single metal inside the through hole, and (ii) electrically connected to the light-receiving surface electrode via a conductive material.

5. The solar cell according claim 4, wherein an upper surface of the protruding portion of the male member is roughened.

6. The solar cell according to claim 4, wherein the one-surface side of the flat portion is fixed to the other-surface side of the semiconductor substrate by an adhesive.

7. The solar cell according to claim 4, wherein at least a contact surface of the flat portion of the metal member on the other-surface side of the semiconductor substrate is coated by an insulating film.

8. The solar cell according to claim 7, wherein an entire surface of the metal member, except an upper surface of the protruding portion and a part of an other surface of the flat portion, is coated by an insulating film.

9. The solar cell according to claim 8, wherein the back-surface electrode is formed on an entire surface on the other-surface side of the semiconductor substrate.

* * * * *